(12) United States Patent
Hagiwara et al.

(10) Patent No.: US 12,091,257 B2
(45) Date of Patent: Sep. 17, 2024

(54) ARTICLE TRANSPORT FACILITY (71) Applicant: Daifuku Co., Ltd., Osaka (JP)

(72) Inventors: Koichi Hagiwara, Komaki (JP); Shota Masamura, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 684 days.

(21) Appl. No.: 17/328,111

(22) Filed: May 24, 2021

(65) Prior Publication Data

US 2021/0362957 A1 Nov. 25, 2021

(30) Foreign Application Priority Data

May 25, 2020 (JP) ................................ 2020-090372

(51) Int. Cl.
*G06F 7/00* (2006.01)
*B65G 1/04* (2006.01)
(Continued)

(52) U.S. Cl.
CPC ........... *B65G 43/02* (2013.01); *B65G 1/0457* (2013.01); *B66C 13/40* (2013.01); *B66C 19/00* (2013.01); *H01L 21/67724* (2013.01); *H01L 21/67727* (2013.01); *B65G 2203/0258* (2013.01); *B65G 2203/0275* (2013.01); *B65G 2203/0283* (2013.01); *B65G 2203/0291* (2013.01); *B65G 2203/042* (2013.01); *B65G 2811/0678* (2013.01); *B65G 2811/095* (2013.01)

(58) Field of Classification Search
CPC .................. B65G 43/02; B65G 1/0457; B65G 2203/0258; B65G 2203/0275; B65G 2203/0283; B65G 2203/0291; B65G 2203/042; B65G 2811/0678; B65G 2811/095; B65G 1/0492; B65G 1/1373; B65G 2201/0297; B66C 13/40; B66C 19/00; H01L 21/67724; H01L 21/67727; H01L 21/67259; H01L 21/67276; H01L 21/67294; H01L 21/67715; H01L 21/67733; H01L 21/67288; H01L 21/67706; B61B 3/02
USPC ........................................ 700/213, 229, 230
See application file for complete search history.

(56) References Cited

U.S. PATENT DOCUMENTS

| 8,712,600 | B2 | 4/2014 | Hayashi |
| 2011/0251735 | A1 | 10/2011 | Hayashi |
| 2020/0363212 | A1* | 11/2020 | Suzuki ................... G01C 21/38 |

FOREIGN PATENT DOCUMENTS

| JP | 2011221687 A | 11/2011 |
| JP | 2018132332 A | 8/2018 |

* cited by examiner

*Primary Examiner* — Yolanda R Cumbess
(74) *Attorney, Agent, or Firm* — The Webb Law Firm (57) ABSTRACT

A travel path of an article transport facility provided with a plurality of article transport vehicles that travel along the travel path and transport articles, and a control device that controls operation of the article transport vehicles includes a path set in an inspection area for causing a target transport vehicle designated as an inspection target from among the plurality of article transport vehicles to travel along. The target transport vehicle includes a sensor that detects behavior of the target transport vehicle during travel. The control device controls the plurality of article transport vehicles such that only the one target transport vehicle is present in the inspection area, and causes the target transport vehicle to travel in the inspection area in an inspection travel pattern prescribed in advance.

6 Claims, 6 Drawing Sheets

(51) Int. Cl.
*B65G 43/02* (2006.01)
*B66C 13/40* (2006.01)
*B66C 19/00* (2006.01)
*H01L 21/677* (2006.01)

ARTICLE TRANSPORT FACILITY

CROSS-REFERENCE TO RELATED APPLICATION

This application claims priority to Japanese Patent Application No. 2020-090372 filed May 25, 2020, the disclosure of which is hereby incorporated by reference in its entirety.

BACKGROUND OF THE INVENTION

1. Field of the Invention

The present invention relates to an article transport facility provided with a plurality of article transport vehicles that travel along a prescribed travel path and transport articles and a control device that controls operation of the article transport vehicles.

2. Description of Related Art

In appropriately maintaining an article transport facility provided with article transport vehicles that travel along a travel path, it is preferable to ascertain the degree of wear of the article transport vehicles. JP 2018-132332A discloses an inspection system that inspects the degree of abrasion of the wheels of article transport vehicles. This inspection system is provided with unique identification marks for every wheel that are provided on a lateral surface of each of a plurality of wheels, and an image shooting apparatus that shoots a global image of the wheels during travel from the side of the travel path, and, based on the shot image data, inspects the degree of abrasion of the wheels along with individually specifying wheels targeted for inspection using the identification marks.

SUMMARY OF THE INVENTION

The above inspection system is able to appropriately inspect the abrasion of wheels. However, since article transport vehicles that are transporting articles travel under various travel conditions, wheel attitude and the like may change depending on the behavior of the article transport vehicle during travel. Thus, there is the possibility of variability occurring in the inspection results. Accordingly, it is preferable to be able to appropriately inspect the states of article transport vehicles for determining the maintenance period under uniform conditions.

In view of the above background, it is desired to appropriately acquire information representing the states of article transport vehicles for determining the maintenance period.

An article transport facility conceived in view of the above is an article transport facility including a plurality of article transport vehicles that travel along a prescribed travel path and transport an article and a control device that controls operation of the article transport vehicles, the travel path including a path set in an inspection area for causing a target transport vehicle designated as an inspection target from among the plurality of article transport vehicles to travel along, the target transport vehicle including a sensor that detects behavior of the target transport vehicle during travel, the control device controlling the plurality of article transport vehicles such that only the one target transport vehicle is present in the inspection area, and causing the target transport vehicle to travel in the inspection area in an inspection travel pattern prescribed in advance, and the control device acquiring inspection data that is based on a detection result of the sensor from the target transport vehicle during travel in the inspection travel pattern.

According to this configuration, the behavior of a target transport vehicle that is traveling in an inspection travel pattern prescribed in advance is detected by a sensor, and a control device acquires inspection data generated by the sensor. Accordingly, the states of the article transport vehicles can be acquired under the same conditions. Because control is performed such that there is only one target transport vehicle present in the inspection area, the target transport vehicle is able to travel on the path set in the inspection area in the inspection travel pattern prescribed in advance, without being affected by other article transport vehicles. That is, according to this configuration, information representing the states of article transport vehicles for determining the maintenance period can be appropriately acquired.

Further features and advantages of the article transport facility will become clear from the following description of illustrative and non-limiting embodiments given with reference to the drawings.

DETAILED DESCRIPTION OF PREFERRED EMBODIMENTS

Figure 1:
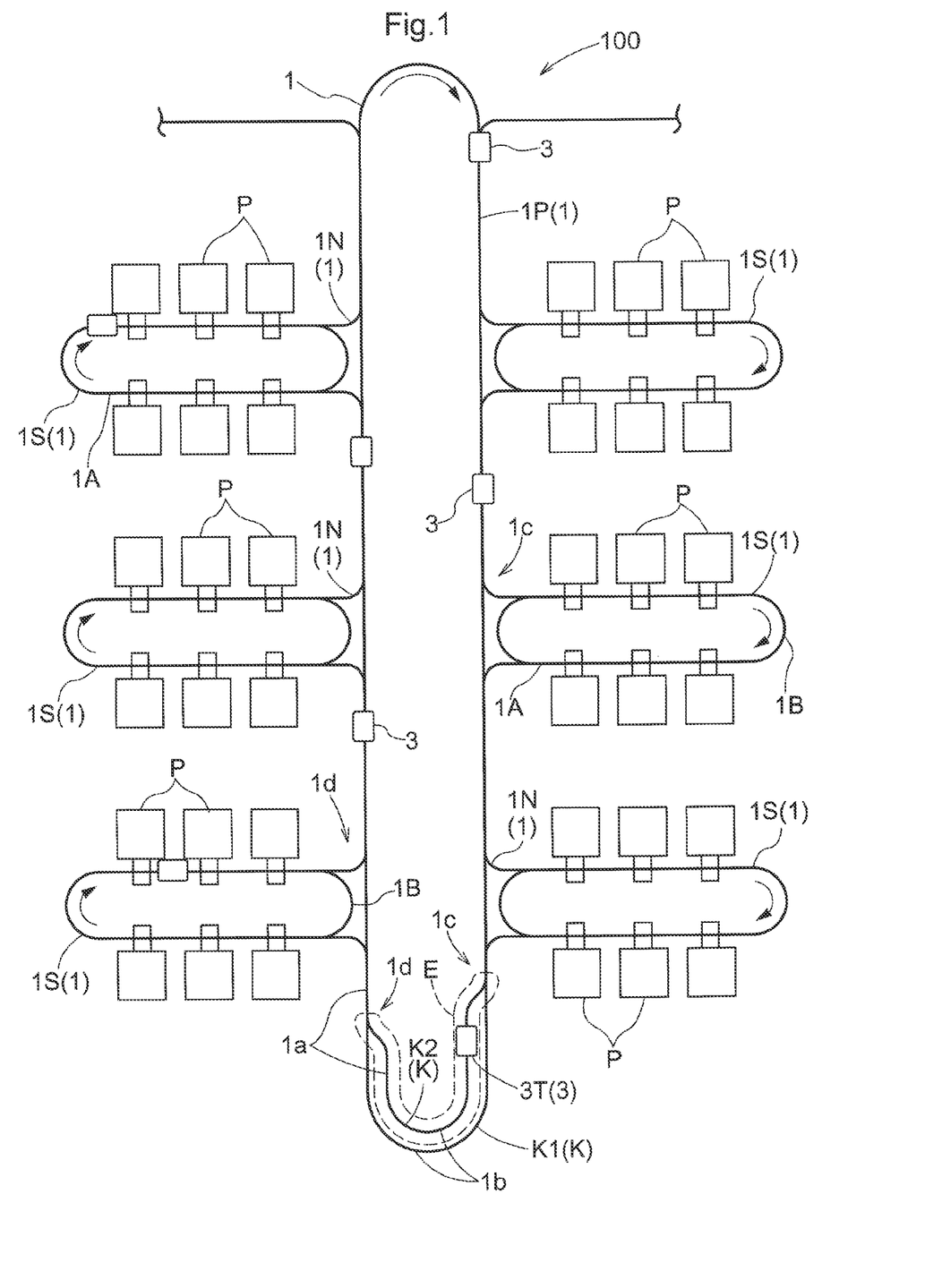
FIG. 1 is a plan view of an article transport facility.
Figure 7:
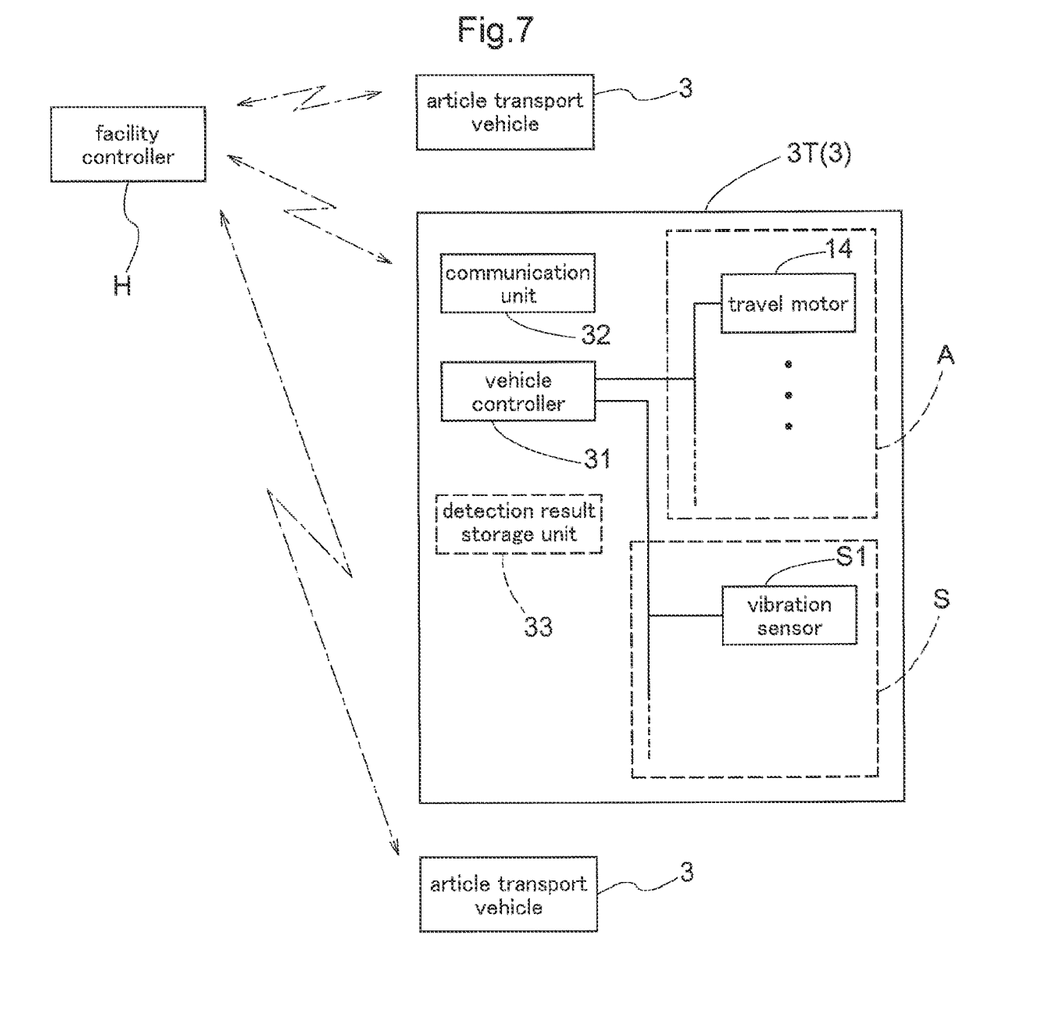
FIG. 7 is a block diagram showing an example of the configuration of an article transport facility.

Hereinafter, embodiments of an article transport facility will be described based on the drawings. As shown in FIGS. 1 and 7, an article transport facility 100 is provided with a travel rail 2 installed along a travel path 1, a plurality of article transport vehicles 3 that travel along the travel path 1 and transport articles W, and a facility controller H (control device) that controls operation of the article transport vehicles 3. In the present embodiment, the article transport vehicles 3, ceiling transport vehicles that travel on a travel rail 2 (see FIGS. 2, 3, etc.) supported in a suspended manner by a ceiling as will be described later, and transport articles W supported in a suspended manner are illustrated as an example. Also, in the present embodiment, the article transport vehicles 3 transport FOUPs (Front Opening Unified Pods) that house semiconductor wafers as the articles W. As shown in FIG. 1, the article transport facility 100 is provided with a plurality of article processing units P that perform various processing on the semiconductor wafers. The article transport vehicles 3 transport the articles W to the plurality of article processing units P.

In the following description, the direction along the travel path 1 will be referred to as a path longitudinal direction X, and the direction, which is both orthogonal to the path longitudinal direction X and the up-down direction Z, will be referred to as a path width direction Y. Also, on the travel path 1, the travel direction of the article transport vehicles 3 (direction in which the article transport vehicles 3 travel)

will be referred to as the downstream side and the opposite side thereto will be referred to as the upstream side in the following description.

As shown in FIG. 1, the travel path 1 is provided with one annular main path 1P, a plurality of annular sub-paths 1S, and a connecting path 1N that connects the main path 1P and the sub-paths 1S. The sub-paths 1S are each annularly formed via the plurality of article processing units P and connected to the main path 1P at a branching part 1c and a merging part 1d. The connecting path 1N includes a branching connecting path 1N at the branching parts 1c that causes the article transport vehicles 3 to branch and travel toward the sub-paths 1S from the main path 1P, and a merging connecting path 1N at the merging parts 1d that causes the article transport vehicles 3 to merge and travel toward the main path 1P from the sub-paths 1S. The article transport vehicles 3 all travel in the same circumferential direction (clockwise in the present embodiment) on the main path 1P and the plurality of sub-paths 1S. Note that, in FIG. 1, the travel direction of the article transport vehicles 3 is shown by arrows.

Figure 2:
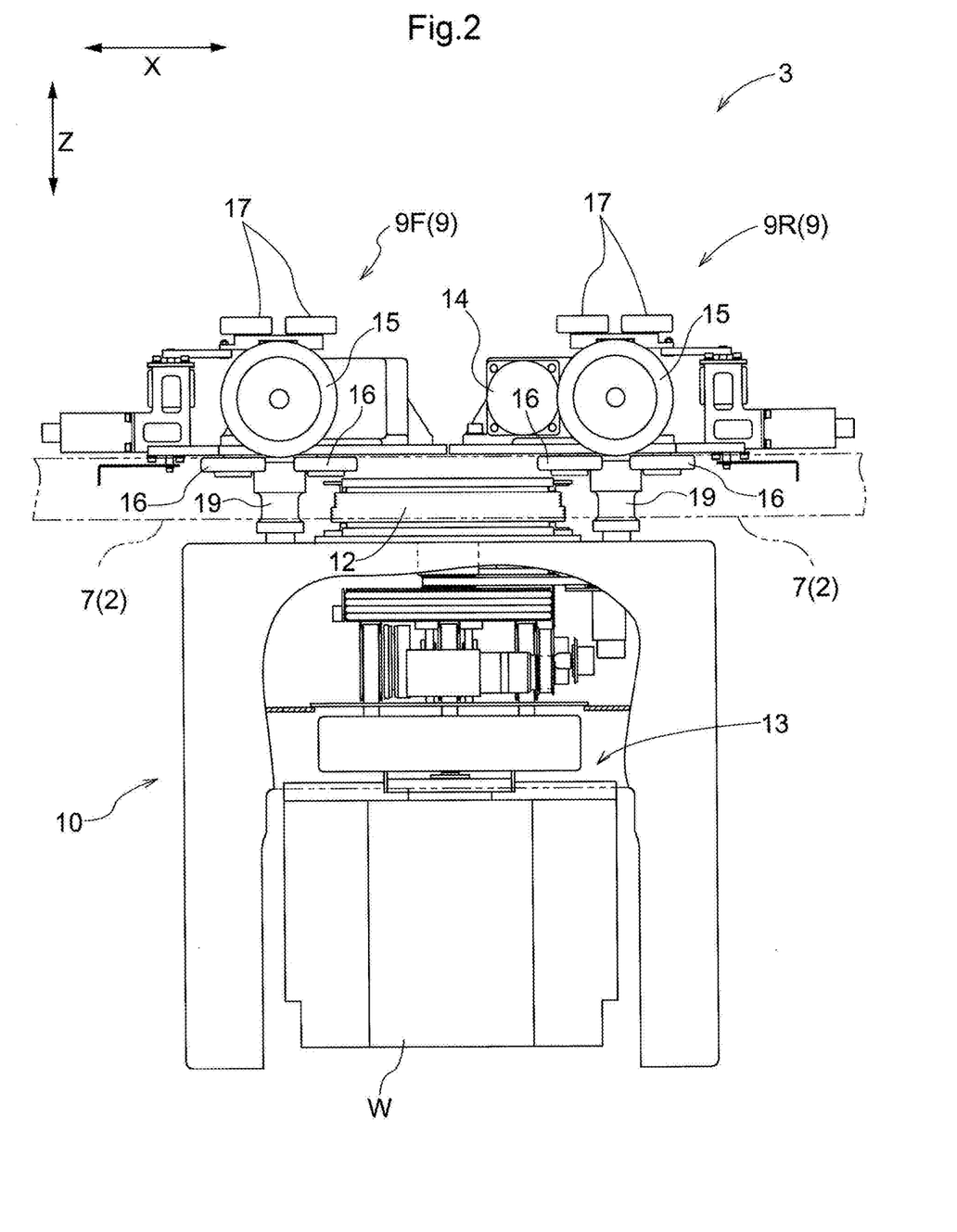
FIG. 2 is a side view of an article transport vehicle.
Figure 3:
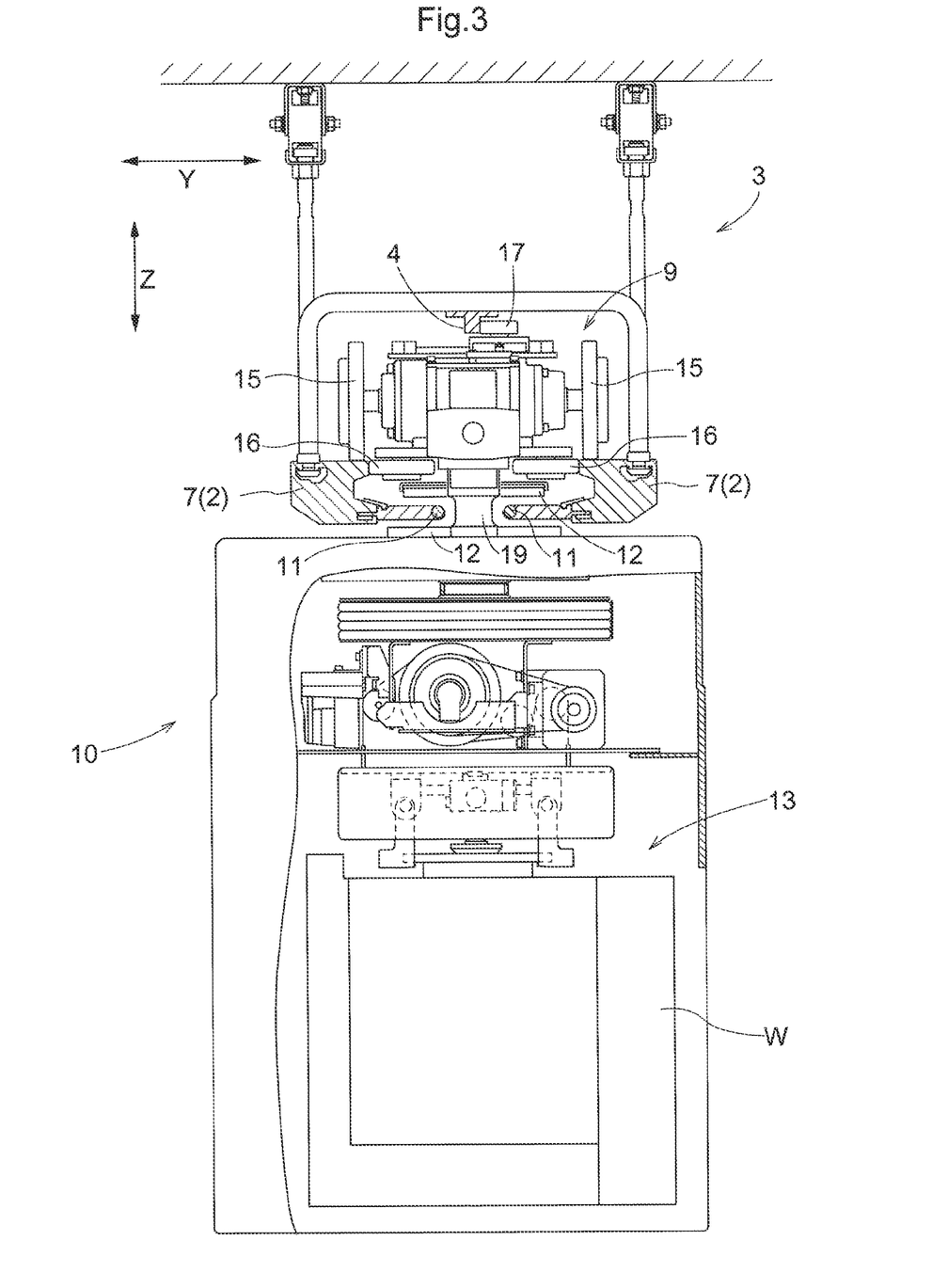
FIG. 3 is a front view of an article transport vehicle.

As shown in FIG. 3, the travel rail 2 is constituted by a left-right pair of rail parts 7. As shown in FIGS. 2 and 3, the article transport vehicles 3 are provided with a travel part 9 that travels on the travel rail 2 supported in a suspended manner from the ceiling, a main body part 10 that is located downward of the travel rail 2 and is supported in a suspended manner by the travel part 9, and a power receiving part 12 that contactlessly receives drive power from a power supply line 11 arranged along the travel path 1. The main body part 10 is provided with a support mechanism 13 that is provided to freely move up and down in the main body part 10 and supports the article W in a suspended state.

The travel part 9 includes a first travel part 9F and a second travel part 9R that are aligned in the front-rear direction of the article transport vehicles 3. The first travel part 9F and the second travel part 9R have the same configuration, and, hereinafter, will be simply described as the travel parts 9, in the case where there is no particular need to distinguish therebetween. The travel parts 9 are provided with a travel motor 14 and a left-right pair of travel wheels 15 that are rotationally driven by the travel motor 14. The left-right pair of travel wheels 15 roll along the upper surface of the travel rail 2 (left-right pair of rail parts 7). Also, the travel parts 9 are provided with guide wheels 16 that rotate about vertical axes (about up-down axes) parallel to the up-down direction Z. The guide wheels 16 are disposed on the right and left of the travel parts 9, with two guide wheels disposed so as to be aligned in the front-rear direction on both the left and right sides of the travel parts 9. In other words, four guide wheels 16 are provided for every one travel part 9. The guide wheels 16 roll along opposing lateral surfaces of the left-right pair of rail parts 7. The guide wheels 16 contact the travel rail 2 at a plurality of places separated from each other in the path longitudinal direction X (direction parallel to the travel path 1).

The first travel part 9F and the second travel part 9R are each provided with a connecting shaft 19 in a state of protruding downward of the lower edge of the travel wheels 15. The connecting shaft 19 of the first travel part 9F and the main body part 10 are connected to be relatively rotatable about a vertical axis parallel to the up-down direction Z. The connecting shaft 19 of the second travel part 9R and the main body part 10 are connected to be relatively rotatable about a vertical axis parallel to the up-down direction Z. In other words, the first travel part 9F and the second travel part 9R are independently rotatable about different vertical axes.

The article transport vehicles 3 travel along the travel path 1 while being positionally regulated in the path width direction Y, due to the travel wheels 15 of the travel parts 9 being rotationally driven by the travel motor 14 and the guide wheels 16 of the travel parts 9 being guided by the pair of rail parts 7. The article transport vehicles 3 are also able to travel along the travel path 1 where the path curves such as at curved paths 1b, the branching parts 1c and the merging parts 1d, due to the first travel part 9F and the second travel parts 9R swinging about vertical axes relative to the main body 10.

Figure 4:
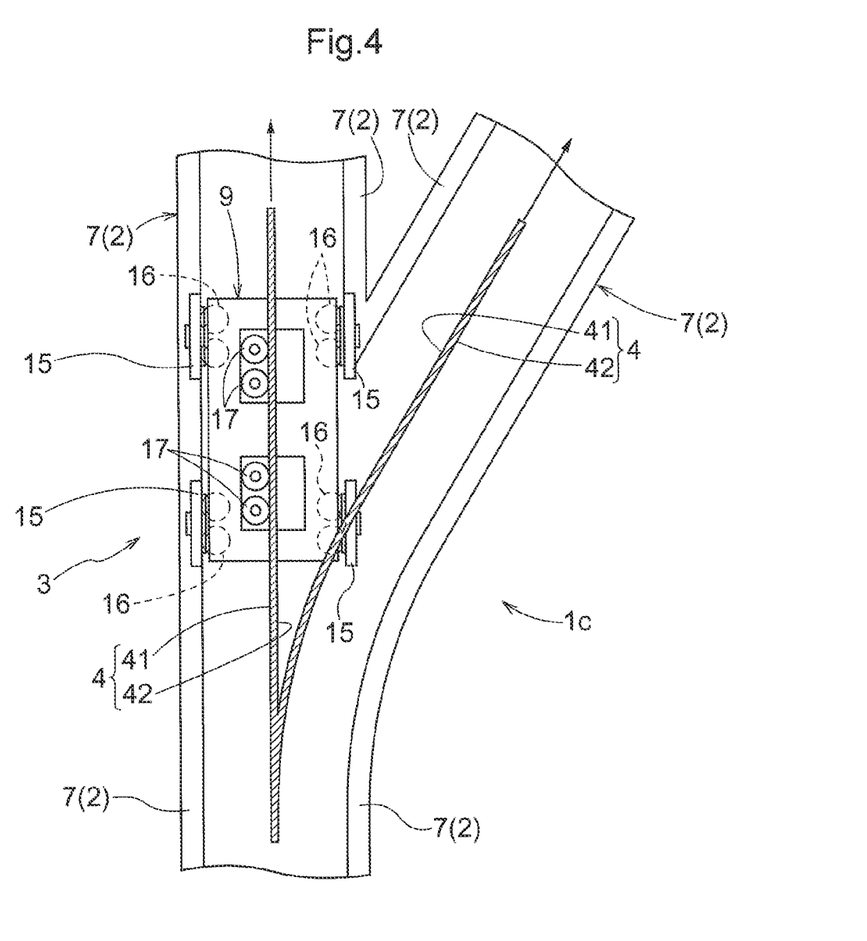
FIG. 4 is a diagram showing the behavior of an article transport vehicle that travels straight ahead at a branching part.
Figure 5:
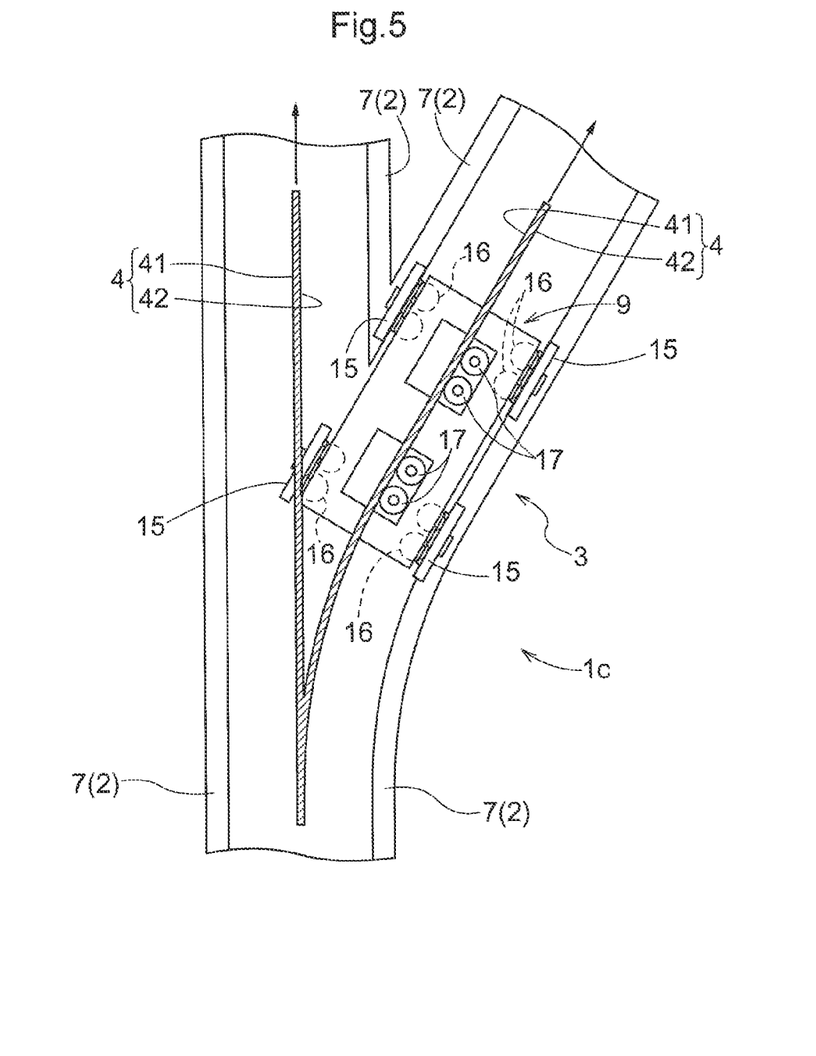
FIG. 5 is a diagram showing the behavior of an article transport vehicle that branches at a branching part.

As shown in FIGS. 3 to 5, the branching parts 1c of the travel path 1 are provided with a guide rail 4 formed with a T-shaped cross-sectional shape when viewed in the travel direction of the article transport vehicles 3. Also, the article transport vehicles 3 are provided with guide assist wheels 17 that rotate about vertical axes (about up-down axes) parallel to the up-down direction Z. Two guide assist wheels 17 are disposed to be aligned in the front-rear direction in a central part of the travel parts 9 so as to be movable in the left-right direction. The guide assist wheels 17 are provided to be positionally changeable between the right side and the left side of the guide rail 4 disposed in a central part between the left-right pair of rail parts 7 in the path width direction Y, and rotate in contact with the right lateral surface or the left lateral surface of the guide rail 4. A vehicle controller 31 moves the guide assist wheels 17 in the vehicle body width direction (path width direction Y) at the branching part 1c as shown in FIGS. 3 to 5.

As shown in FIG. 4, in the case of causing the article transport vehicle 3 to travel straight ahead without branching at the branching part 1c, the vehicle controller 31 positions the guide assist wheels 17 on a first guide surface 41 side (left side when facing in the movement direction) of the guide rail 4. The travel parts 9 are thereby guided in a state where the guide assist wheels 17 abut the first guide surface 41 of the guide rail 4. As shown in FIG. 4, when traveling straight past the branching part 1c, although the travel rail 2 on one of the left and right sides (here, right side) of the pair of rail parts 7 is discontinuous, the travel parts 9 are inhibited from coming off the travel rail 2 of the other of the left and right sides (here left side) that is not discontinuous, due to the guide rail 4 bearing the load and guiding and supporting the travel parts 9 via the guide assist wheels 17, enabling the article transport vehicle 3 to travel straight ahead at the branching part 1c.

As shown in FIG. 5, in the case where the article transport vehicle 3 is branched at the branching part 1c, the vehicle controller 31 positions the guide assist wheels 17 on a second guide surface 42 side (right side when facing in the movement direction) of the guide rail 4. The travel parts 9 are thereby guided in a state where the guide assist wheels 17 abut the second guide surface 42 of the guide rail 4. As shown in FIG. 5, when branching at the branching part 1c, although the travel rail 2 on one of the left and right sides (here, left side) of the pair of rail parts 7 is discontinuous, the travel parts 9 are inhibited from coming off the travel rail 2 of the other of the left and right sides (here right side) that is not discontinuous, due to the guide rail 4 bearing the load and guiding and supporting the travel parts 9 via the guide assist wheels 17, enabling the article transport vehicle 3 to branch at the branching part 1c.

In the above, modes of the article transport vehicles 3 traveling straight ahead and branching at the branching parts 1c were described, but this similarly applied to the merging parts 1d.

As shown in FIG. 7, the article transport vehicles 3 are provided with the vehicle controller 31, a communication unit 32, an actuator group A, and a sensor group S. The sensor group S includes a code reader, not shown, that reads position marks indicating position information that are disposed along the travel path 1, a rotary encoder, not shown, that detects the travel distance of the article transport vehicles 3 based on the number of rotations of the travel wheels 15, and an obstacle sensor, not shown, that detects other article transport vehicles 3, obstacles and the like in the movement direction. The actuator group A includes the travel motor 14 that drives the travel wheels 15, an actuator, not shown, that moves the guide assist wheels 17 in the vehicle body width direction (path width direction Y), and an actuator, not shown, that moves the support mechanism 13 up and down.

The vehicle controller 31 determines the position of the article transport vehicle 3 on the travel path 1, based on the detection results of the code reader or the rotary encoder. The position information of each article transport vehicle 3 is transmitted to the facility controller H and other article transport vehicles 3 by wireless communication. The facility controller H controls the travel of the article transport vehicles 3 in the article transport facility 100, based on the position information on each article transport vehicle 3. The vehicle controller 31 transports the article W based on a transport instruction from the facility controller H. The vehicle controller 31 causes the article transport vehicle 3 that supports the article W in a suspended manner to travel autonomously, based on the transport instruction, the position information of the vehicle, the position information of the other vehicles, the detection result of the obstacle sensor, and the like.

As described above, the article transport vehicle 3 has members that suffer abrasion due to contact with the travel rail 2 and the guide rail 4, such as the travel wheels 15, the guide wheels 16 and the guide assist wheels 17, and members that wear with travel of the article transport vehicle 3, such as the travel motor 14 and other actuators. Also, the bearings that support axles of the travel wheels 15, the guide wheels 16, the guide assist wheels 17 and the like may also wear or fail. For example, rotational resistance increases when bearings fail. Thus, the article transport vehicles 3 preferably undergo maintenance periodically, such as checks and component replacement. Although it is also possible to perform maintenance during set periods, maintenance will not necessarily be performed during suitable periods for the respective article transport vehicles 3. Accordingly, it is preferable that the state of each part of the article transport vehicle 3 is detected and maintenance such as component replacement and adjustment is performed according to the state of the article transport vehicle 3.

In view of this, in the article transport facility 100 of the present embodiment, inspection data is collected from an article transport vehicle 3 that is actually transporting the article W, and the period for maintenance such as component replacement and adjustment is determined based on the inspection data. At this time, the maintenance period may be determined by comparing the inspection data with normal reference values, or may be determined based on big data obtained by integrating a plurality of inspection data. Here, the article transport vehicle 3 targeted for extracting inspection data will be referred to as a target transport vehicle 3T. The target transport vehicle 3T is provided with a sensor (e.g., vibration sensor S1) that detects the behavior of the vehicle during travel. The target transport vehicle 3T is an article transport vehicle 3 designated by the facility controller H as an inspection target from among the plurality of article transport vehicles 3. Note that a mode may be adopted in which all of the article transport vehicles 3 can be designated as target transport vehicles 3T, or one or more of the total number of article transport vehicles 3 can be designated as target transport vehicles 3T.

Figure 6:
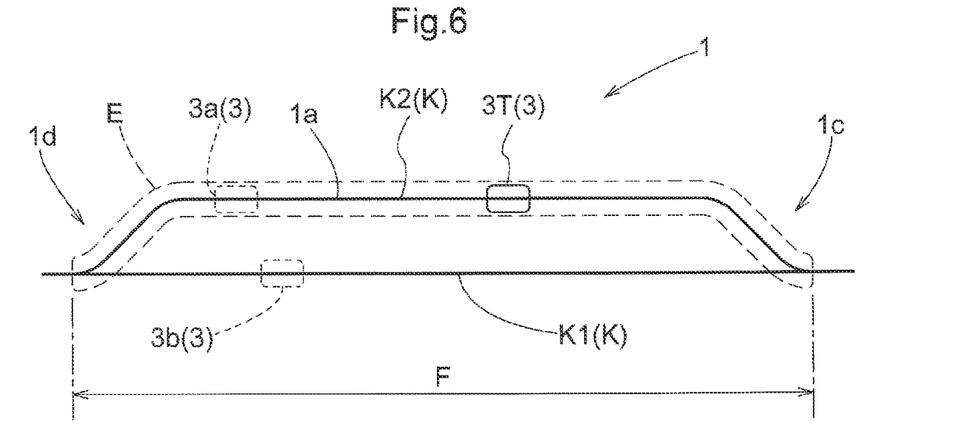
FIG. 6 is a diagram schematically showing an example of an inspection area.

Also, as shown in FIGS. 1 and 6, the travel path 1 includes a path K set in an inspection area E for causing the designated target transport vehicle 3T to travel along. The facility controller H controls the plurality of article transport vehicles 3 such that there is only one target transport vehicle 3T present in the inspection area E. In the case where there is another article transport vehicle 3 (another vehicle) traveling in front thereof, the article transport vehicle 3 may reduce travel speed or temporarily stop and wait, in order to avoid a collision. When there is another vehicle in front of the target transport vehicle 3T, as indicated by the reference sign "3a" in FIG. 6, and the target transport vehicle 3T reduces travel speed or temporarily stops as described above, there is a possibility that the travel will no longer be suitable for inspection, and that the facility controller H will be unable to obtain appropriate inspection data. However, in the present embodiment, travel of the plurality of article transport vehicles 3 is controlled such that there is only the one target transport vehicle 3T present in the inspection area E. Accordingly, the target transport vehicle 3T is able to travel in a mode suitable for inspection without being affected by other vehicles traveling in front thereof.

Also, the facility controller H causes the target transport vehicle 3T to travel in an inspection travel pattern prescribed in advance in the inspection area E. The facility controller H acquires inspection data that is based on the detection result of a sensor (vibration sensor S1, etc.) from the target transport vehicle 3T during travel in the inspection travel pattern. Because control is performed such that there are no other article transport vehicles 3 (other vehicles) present in the inspection area E apart from the target transport vehicle 3T, as described above, the target transport vehicle 3T is able to travel in the prescribed inspection travel pattern without being affected by other vehicles. The facility controller H is able to obtain inspection data having high reproducibility, due to the target transport vehicle 3T traveling in the prescribed inspection travel pattern without being affected by other vehicles.

Here the sensor that detects the behavior of the vehicle during travel in the target transport vehicle 3T detects at least one of the torque of the travel motor 14 that causes the target transport vehicle 3T to travel, the rotational speed of the travel wheels 15 of the target transport vehicle 3T or a rotational member that moves in tandem with the travel wheels 15, and the vibration of the target transport vehicle 3T.

For example, in the case where the frictional force has increased due to the travel wheels 15, the guide wheels 16, the guide assist wheels 17 or the like becoming worn, the rotational resistance may increase, requiring the travel motor 14 to produce a large torque. The magnitude of the torque may be detected by a torque sensor, or may be detected based on variables such as the magnitude of current that flows through the drive circuit of the travel motor 14. Note that the magnitude of the torque is not limited to being measured using a torque sensor, and may be calculated using a servo driver that controls the travel motor 14 in the vehicle controller 31.

Also, when the diameter of the travel wheels 15 decreases due to abrasion or the like, the travel distance differs even when traveling at the same rotational speed. For example, as described above, in the case where position marks indicating position information are disposed along the travel path 1, the travel distance can be detected based on the position marks. The state of abrasion of the travel wheels 15 can be determined, by comparing this travel distance with a travel distance that is based on rotational speed. Accordingly, a sensor (rotation sensor such as a rotary encoder) that detects the rotational speed of the travel wheels 15 can be used as the sensor that detects behavior. Note that the sensor is not limited to detecting the rotational speed of the travel wheels 15, and may be a sensor that detects the rotational speed of a rotational member provided on a power transmission path from the travel motor 14 to the travel wheels 15. Also, a code reader that reads position marks may also be included in the sensor that detects behavior.

Also, when the travel wheels 15, the guide wheels 16, the guide assist wheels 17 or the like wear due to abrasion and the like, the stability of the article transport vehicles 3 may deteriorate and vibration of the article transport vehicles 3 during travel may increase. By detecting the magnitude of vibration with the vibration sensor S1, the facility controller H is able to determine the extent to which the travel wheels 15, the guide wheels 16, the guide assist wheels 17 and the like are worn. Accordingly, the vibration sensor S1 corresponds to a sensor that detects behavior.

Incidentally, in the above description, a mode for determining the state of abrasion or the like of mainly components of the article transport vehicle 3 is illustrated as an example. However, the present invention is not limited to such a mode, and the state of the rotary encoder may be assessed, based on the difference between the position of the article transport vehicle 3 that is based on the detection result of the rotary encoder and the position of the article transport vehicle 3 that is based on the detection result of the code reader. Also, the sensor sensitivity or the like of the code reader and other sensors such as a stop position detection sensor (not shown) may be assessed, by using the difference between a stop position designated on the travel path 1 and an actual stop position of the article transport vehicle 3 as inspection data.

As described above, the travel wheels 15 roll on the upper surface of the travel rail 2, and the guide wheels 16 roll on the lateral surface of the travel rail 2. In other words, the travel wheels 15 and the guide wheels 16 are in contact with the travel rail 2 throughout the entire area of the travel path 1 except for some parts within the branching parts 1c and the merging parts 1d. On the other hand, the guide assist wheels 17 roll on the lateral surface of the guide rail 4. Since the guide rail 4 is provided at the branching parts 1c and the merging parts 1d, the guide assist wheels 17 come in contact with the guide rail 4 at some parts of the travel path 1, specifically, only at the branching parts 1c and the merging parts 1d. Accordingly, the inspection area E preferably includes a branching part 1c where the path K branches into a plurality of paths and a merging part 1d where a plurality of paths K merge together. Also, the shape of the path K other than the branching part 1c and the merging part 1d is not limited to being a straight line and may also be curved. Accordingly, the inspection area E preferably includes a straight path (straight path 1a) and a curved path (curved path 1b).

In FIG. 1, a mode in which the straight path 1a, the curved path 1b, the branching part 1c and the merging part 1d are included in one compact inspection area E is illustrated as an example. However, the inspection area E may be divided and disposed in a plurality of places. For example, a first inspection area E including only the straight path 1a, a second inspection area E including only the curved path 1b, a third inspection area E including the branching part 1c and a fourth inspection area E including the merging part 1d into which the inspection area is divided may be disposed.

Also, in FIGS. 1 and 6, a mode in which an inspection path K (inspection path K2) is provided separately to the path K (normal path K1) on which the article transport vehicles 3 travel in order to transport the articles W is illustrated as an example. However, all or part of the inspection path K2 may be provided for use also as the normal path K1. For example, even in the case where the inspection path K2 is provided separately to the normal path K1, as in the modes illustrated in FIGS. 1 and 6, it can be said that the branching part 1c from the normal path K1 to the inspection path K2 and the merging part 1d from the inspection path K2 to the normal path K1 are used by both the normal path K1 and the inspection path K2.

Also, the inspection travel pattern is set so as to include acceleration, deceleration and constant speed travel. For example, when accelerating or decelerating, the frictional force between the travel rail 2 and the travel wheels 15 also exerts an effect. Sliding of the travel wheels 15 may also occur, depending on the degree of wear of the travel wheels 15. The facility controller H is able to obtain appropriate inspection data, due to the inspection travel pattern being set to include not only constant speed travel but also acceleration and deceleration.

Also, as shown in FIGS. 1 and 6, in the present embodiment, the inspection area E is set to include one (inspection path K2) of two paths K parallelly disposed and on which the movement directions of the article transport vehicles 3 are in the same direction. Due to the inspection area E being set in such a manner, the article transport vehicles 3 that are not designated as the target transport vehicle 3T can be caused to travel using the normal path K1, such as the article transport vehicle 3 indicated with the reference sign "3b" in FIG. 6, and the target transport vehicle 3T can be caused to travel using the inspection path K2 parallel thereto. The target transport vehicle 3T is able to travel on the inspection path K2 according to the inspection travel pattern, without being affected by other vehicles. Moreover, because the other article transport vehicles 3 can be caused to travel on the normal path K1 that is parallel to the inspection path K2 in order to transport the articles W, a drop in the transport efficiency of the article transport facility 100 is also suppressed.

As shown in FIG. 6, in the case where the inspection path K2 and the normal path K1 are installed parallel to each other, the branching part 1c from the normal path K1 to the inspection path K2 and the merging part 1d from the inspection path K2 to the normal path K1 include both the normal path K1 and the inspection path K2. Accordingly, it can be said that the inspection area E (inspection path K2) is disposed parallel to a parallel section F of the normal path K1 that includes the branching part 1c and the merging part 1d, as shown in FIG. 6.

Incidentally, as described above, it is possible for some (a plurality) or all of the plurality of article transport vehicles 3 to be designated as target transport vehicles 3T. In the present embodiment, an article transport vehicle 3 is designated as the target transport vehicle 3T, on condition that the weight (transport weight) of the article W during transportation is a common prescribed value. The facility controller H is thereby able to collect inspection data under uniform conditions.

Semiconductor wafers are housed in FOUPs serving as the articles W, and thus the weight of a FOUP fully loaded with semiconductor wafers, the weight of a FOUP (empty FOUP) in which semiconductor wafers are not housed, or the weight of a FOUP in which a prescribed number of semiconductor wafers are housed, for example, can be taken as the prescribed value of transport weight. For example, it is favorable for the weight of a FOUP fully loaded with semiconductor wafers, which is the severest condition, that is, the heaviest transport weight, under which the article transport vehicles 3 will travel, to be taken as the prescribed value. Note that transport weight also includes the state in which the article transport vehicle 3 is not supporting the article W, that is, zero. The facility controller H designates an article transport vehicle 3 that is transporting an article W whose transport weight is the prescribed value as the target transport vehicle 3T, on condition that the transport weight is the prescribed value.

As shown in FIG. 7, the article transport vehicles 3 are provided with the communication unit 32 capable of wireless communication with the facility controller H. Inspection data acquired by the vehicle controller 31 from the sensor group S is wirelessly transmitted from the communication unit 32 to the facility controller H. That is, the target transport vehicle 3T is provided with the vehicle controller 31 serving as a detection result acquisition unit that acquires inspection data and the communication unit 32 serving as an inspection data transmission unit that transmits inspection data, and the communication unit 32 wirelessly transmits inspection data to the facility controller H. The facility controller H is able to sequentially receive and store inspection data.

Note that, as shown in FIG. 7, the target transport vehicle 3T may be provided with a detection result storage unit 33 constituted by a storage medium such as a memory that stores inspection data acquired by the vehicle controller 31. In this case, the communication unit 32 may periodically transmit inspection data stored in the detection result storage unit 33 to the facility controller H. Also, the inspection data stored in the detection result storage unit 33 may be transmitted to the facility controller H through a wired connection with the facility controller H. Alternatively, inspection data may be transmitted via a memory card or the like that is removable from the target transport vehicle 3T and the facility controller H. Also, in the case where the detection result storage unit 33 is removable from the target transport vehicle 3T, the facility controller H may acquire inspection data by the detection result storage unit 33 that has been removed from the target transport vehicle 3T being connected to the facility controller H.

Other Embodiments

Hereinafter, other embodiments will be described. Note that the configuration of each embodiment described below is not limited to being applied independently, and can be applied in combination with the configuration of other embodiments, as long as there are no mutual inconsistencies.

(1) In the above description, a ceiling transport vehicle that travels in a state of being supported in a suspended manner by the travel rail 2 was illustrated as an example of the article transport vehicle 3, but the article transport vehicle 3 may be a transport vehicle that travels in a state of being supported through placement on rails. Alternatively, the article transport vehicle 3 may be a transport vehicle that travels on a path (e.g., floor) constituted by other than rails.

(2) In the above description, a mode in which one or a plurality of inspection areas E include a straight path 1a, a curved path 1b, a branching part 1c and a merging part 1d as paths K was illustrated as an example. In other words, a mode in which the inspection path K2 includes paths K having all of these shapes was illustrated as an example. However, the inspection path K2 may be constituted to include at least one thereof. Also, in the case where an intersecting part (not shown) where two paths K intersect is included in the travel path 1 in addition to the branching part 1c and the merging part 1d, it is favorable for the inspection path K2 to include an intersecting part.

(3) In the above description, a mode in which the facility controller H designates an article transport vehicle 3 to serve as the target transport vehicle 3T on condition that the transport weight is a prescribed value was illustrated as an example. However, the facility controller H may designate the target transport vehicle 3T based on the position of the article transport vehicle 3 on the travel path 1 (position in relation to the inspection path K2), for example, regardless of the transport weight. Note that, in the case where the target transport vehicle 3T is designated regardless of the transport weight, it is favorable to also acquire the transport weight as inspection data.

(4) In the above description, a mode in which the transmission destination of inspection data is the facility controller H was illustrated as an example. However, the present invention is not limited to this mode, and the transmission destination of inspection data may be a data server or the like provided separately to the facility controller H.

(5) In the above description, a mode in which the inspection travel pattern is set to include acceleration, deceleration and constant speed travel was illustrated as an example. However, the present invention is not limited to this mode, and the inspection travel pattern may be set so as to be constituted by only constant speed travel, for example.

Summary of Embodiments

Hereinafter, a brief summary of the article transport facility described above will be given.

As one aspect, the article transport facility is an article transport facility including a plurality of article transport vehicles that travel along a prescribed travel path and transport an article and a control device that controls operation of the article transport vehicles, the travel path including a path set in an inspection area for causing a target transport vehicle designated as an inspection target from among the plurality of article transport vehicles to travel along, the target transport vehicle including a sensor that detects behavior of the target transport vehicle during travel, the control device controlling the plurality of article transport vehicles such that only the one target transport vehicle is present in the inspection area, and causing the target transport vehicle to travel in the inspection area in an inspection travel pattern prescribed in advance, and the control device acquiring inspection data that is based on a detection result of the sensor from the target transport vehicle during travel in the inspection travel pattern.

According to this configuration, the behavior of a target transport vehicle during travel in an inspection travel pattern prescribed in advance is detected by a sensor, and a control device acquires inspection data generated by the sensor. Accordingly, the states of the article transport vehicles can be acquired under the same conditions. Because control is performed such that there is only one target transport vehicle present in the inspection area, the target transport vehicle is able to travel on the path set in the inspection area in the inspection travel pattern prescribed in advance, without being affected by other article transport vehicles. That is, according to this configuration, information representing the states of article transport vehicles for determining the maintenance period can be appropriately acquired.

Also, it is favorable for the sensor to detect at least one of torque of a motor that causes the target transport vehicle to travel, rotational speed of a wheel of the target transport vehicle or a rotational member that moves in tandem with the wheel, and vibration of the target transport vehicle.

The control device is able to determine the extent to which the wheels or motor are worn, due to torque or rotational speed being detected. Also, the control device is able to determine uneven abrasion of wheels, play in rotational members and the like, due to vibration being detected.

Also, it is favorable for the inspection area to include a straight path, a curved path, a branching part where a path branch into a plurality of paths, and a merging part where a plurality of paths merge together, and the inspection travel pattern to include acceleration, deceleration and constant speed travel.

According to this configuration, inspection data in the case of traveling on various paths is obtained, due to the inspection area including paths of various shapes. Also, inspection data in the case of various travel modes is obtained, due to the inspection travel pattern includes various travel states.

Also, it is favorable for the inspection area to be set to include one of two paths parallelly disposed and on which movement directions of the article transport vehicles are in a same direction.

According to this configuration, the target transport vehicle readily branches to an inspection path from the normal path and travels on the inspection path, and again returns to the normal path, for example. Also, since the path for transporting articles is not blocked by travel of the target transport vehicle, transportation of articles by article transport vehicles other than the target transport vehicle is unlikely to be disrupted. Accordingly, with this configuration, inspection data can be appropriately obtained, while suppressing a drop in the use efficiency of the article transport vehicles in the article transport facility.

Also, it is favorable for a weight of the article during transport by the article transport vehicles to be taken as a transport weight, and the control device to designate the article transport vehicles as the target transport vehicle, on condition that the transport weight is a prescribed value.

According to this configuration, comparison of the inspection data of a plurality of target transport vehicles is facilitated, due to adjusting the conditions relating to the transport weight of target transport vehicles to be uniform. The overall tendency of the article transport vehicles is also readily determined, based on the inspection data of a plurality of target transport vehicles.

Also, it is favorable for the target transport vehicle to include a detection result acquisition unit that acquires the inspection data, and an inspection data transmission unit that transmits the inspection data, and the inspection data transmission unit to wirelessly transmit the inspection data to the control device.

According to this configuration, the control device is able to sequentially acquire inspection data from the target transport vehicle. Also, the target transport vehicle need not have a large capacity storage device capable of storing a plurality of iterations of inspection data.

What is claimed is:

1. An article transport facility comprising:
a plurality of article transport vehicles that travel along a prescribed travel path to transport an article; and
a control device that controls operation of the article transport vehicles,
wherein:
the travel path includes a path set in an inspection area, wherein for causing a target transport vehicle designated as an inspection target from among the plurality of article transport vehicles is caused to travel along the path set in the inspection area,
the target transport vehicle includes a sensor that detects the behavior of the target transport vehicle during travel,
the control device controls the plurality of article transport vehicles such that only the one target transport vehicle is present in the inspection area, and causes the target transport vehicle to travel in the inspection area in an inspection travel pattern prescribed in advance, and
the control device acquires inspection data that is based on a detection result of the sensor from the target transport vehicle during travel in the inspection travel pattern.

2. The article transport facility according to claim 1, wherein the sensor detects at least one of torque of a motor that causes the target transport vehicle to travel, rotational speed of a wheel of the target transport vehicle or a rotational member that moves in tandem with the wheel, and vibration of the target transport vehicle.

3. The article transport facility according to claim 1, wherein the inspection area includes a straight path, a curved path, a branching part where a path branch into a plurality of paths, and a merging part where a plurality of paths merge together, and
wherein the inspection travel pattern includes acceleration, deceleration, and constant speed travel.

4. The article transport facility according to claim 1, wherein the inspection area is set to include one of two paths parallelly disposed and on which movement directions of the article transport vehicles are in a same direction.

5. The article transport facility according to claim 1, wherein a weight of the article during transport by the article transport vehicles is taken as a transport weight, and
wherein the control device designates the article transport vehicles as the target transport vehicle based on a condition that the transport weight is a prescribed value.

6. The article transport facility according to claim 1, wherein the target transport vehicle includes a detection result acquisition unit that acquires the inspection data, and an inspection data transmission unit that transmits the inspection data, and
wherein the inspection data transmission unit wirelessly transmits the inspection data to the control device.

* * * * *

UNITED STATES PATENT AND TRADEMARK OFFICE
CERTIFICATE OF CORRECTION

PATENT NO. : 12,091,257 B2
APPLICATION NO. : 17/328111
DATED : September 17, 2024
INVENTOR(S) : Koichi Hagiwara et al.

It is certified that error appears in the above-identified patent and that said Letters Patent is hereby corrected as shown below:

In the Claims

Column 12, Line 12, Claim 1, after "wherein" delete "for causing"

Signed and Sealed this
Nineteenth Day of November, 2024

Katherine Kelly Vidal
*Director of the United States Patent and Trademark Office*